United States Patent
Huang et al.

(10) Patent No.: US 10,697,082 B1
(45) Date of Patent: Jun. 30, 2020

(54) SURFACE-TREATED COPPER FOIL

(71) Applicant: CHANG CHUN PETROCHEMICAL CO., LTD., Taipei (TW)

(72) Inventors: Huei-Fang Huang, Taipei (TW);
Kuei-Sen Cheng, Taipei (TW);
Jui-Chang Chou, Taipei (TW)

(73) Assignee: CHANG CHUN PETROCHEMICAL CO., LTD., Taipei (TW)

( * ) Notice: Subject to any disclaimer, the term of this patent is extended or adjusted under 35 U.S.C. 154(b) by 0 days.

(21) Appl. No.: 16/538,070

(22) Filed: Aug. 12, 2019

(51) Int. Cl.
| | |
|---|---|
| B21C 37/00 | (2006.01) |
| C25D 13/04 | (2006.01) |
| C25D 3/22 | (2006.01) |
| C25D 3/30 | (2006.01) |
| H05K 1/18 | (2006.01) |
| C25D 3/12 | (2006.01) |
| H05K 3/02 | (2006.01) |

(52) U.S. Cl.
CPC ............ C25D 13/04 (2013.01); C25D 3/12 (2013.01); C25D 3/22 (2013.01); C25D 3/30 (2013.01); H05K 1/188 (2013.01); H05K 3/022 (2013.01); Y10T 428/12431 (2015.01); Y10T 428/12438 (2015.01)

(58) Field of Classification Search
None
See application file for complete search history.

(56) References Cited

U.S. PATENT DOCUMENTS

| | | | | |
|---|---|---|---|---|
| 10,070,521 B2* | 9/2018 | Fukuchi | ................. | H05K 3/389 |
| 2003/0162034 A1* | 8/2003 | O'Neill | ..................... | C03C 3/04 |
| | | | | 428/426 |
| 2004/0163842 A1* | 8/2004 | Okada | ..................... | C23C 26/00 |
| | | | | 174/254 |
| 2007/0237976 A1* | 10/2007 | Okada | ..................... | C23C 30/00 |
| | | | | 428/606 |
| 2013/0048976 A1* | 2/2013 | Matsuura | ............... | H01L 51/441 |
| | | | | 257/40 |
| 2013/0175680 A1* | 7/2013 | Gates | ................ | H01L 21/02126 |
| | | | | 257/734 |

FOREIGN PATENT DOCUMENTS

| | | | |
|---|---|---|---|
| JP | WO2013147116 | * | 12/2015 |
| JP | 6357336 B2 | | 7/2018 |

OTHER PUBLICATIONS

PubChem, "Benzoporphyrin", 2019, US National Library of Medicine, pp. 1-13, https://pubchem.ncbi.nlm.nih.gov/compound/benzoporphyrin (Year: 2019).*

* cited by examiner

Primary Examiner — Seth Dumbris
(74) Attorney, Agent, or Firm — Nixon & Peabody LLP; Thomas P. Pavelko

(57) ABSTRACT

The present disclosure relates to an improved, surface-treated copper foil that is resistant to rusting and discoloration. More specifically, the surface-treated copper foil is chromium-free and includes: (a) a copper foil; optionally, (b) a barrier layer on one or both sides of the copper foil, the barrier layer comprising Ni, Zn, Co, Mn, Sn or a mixture thereof; and (c) an organic layer coupled to the one or both sides of the copper foil or one or both barrier layer(s), wherein the sum total of the N, S, and Si elements of the organic layer is more than 5 normalized atomic %.

22 Claims, 2 Drawing Sheets

SURFACE-TREATED COPPER FOIL

FIELD OF THE DISCLOSURE

The present disclosure relates to an improved, surface-treated copper foil that is resistant to corrosion and discoloration. Methods for manufacturing and using the surface-treated copper foil are also described.

BACKGROUND

Electrodeposited copper foil is used in a variety of products. For example, it is an indispensable part of printed circuit boards. Double-sided glossy copper foil is coated with an electrode active material and used as the negative electrode plate of a lithium ion secondary battery. Many electronic products therefore rely, at least in part, on electrodeposited copper foil.

A typical device for manufacturing an electrodeposited copper foil comprises a metal cathode drum and an insoluble dimensionally stable anode (DSA), the metal cathode drum being rotatable and having a polished surface. The insoluble metal anode is arranged at approximately the lower half of the metal cathode drum and surrounds the metal cathode drum. An electrodeposited copper foil is continuously manufactured with the device by flowing a copper electrolytic solution between the cathode drum and the anode, applying direct current between these to allow copper to be electrodeposited on the cathode drum, and detaching an electrodeposited copper foil from the cathode drum when a predetermined thickness is obtained.

A typical printed circuit board is manufactured by attaching a copper foil to a substrate such as an epoxy resin-impregnated glass fiber substrate. The copper foil is bonded to the substrate by application of heat and pressure. Upon performing the bonding, portions of the copper foil that are not used for making the circuit connections are removed, for example, with an etching solution such as an acidic or alkaline etching solution.

In order for such printed circuit board to function properly, corrosion and discoloration of the copper foil should be prevented. The prevention of such corrosion and discoloration is currently performed by applying a chromium-based component to the copper foil through chromium plating or chromate treatment. Due to the negative environmental impacts of chromium, an alternative form of treatment for preventing corrosion and discoloration of a copper foil used in a printed circuit board is desirable.

SUMMARY OF THE DISCLOSURE

The present disclosure relates to an improved, surface-treated copper foil that is resistant to corrosion and discoloration. The copper-foil is unique in that is does not contain chromium, yet it is surprisingly resistant to deterioration, corrosion, and discoloration, especially when subjected to the heat and pressure needed to bond the copper foil to a substrate in the manufacture of a circuit board. The surface-treated copper foil is prepared by optionally forming a barrier layer on one or both sides of electrodeposited copper foil and coupling an organic layer to one or both sides of the copper foil or to one or both of the barrier layer(s), in other words, the structure of the chromium-free surface-treated copper foil could be (1) the organic layer disposed on copper foil on one side or both sides or (2) the barrier layer disposed on copper foil on one side or both sides and the organic layer disposed on barrier layer.

The surface-treated copper foil of the present disclosure is chromium-free and typically includes: (a) copper foil; optionally, (b) a barrier layer on one or both sides of the copper foil, the barrier layer comprising Ni, Zn, Co, Mn, Sn or a mixture thereof; and (c) an organic layer coupled to one or both sides of the copper foil or one or both of the barrier layer(s), wherein the sum total of the N, S, and Si elements of the organic layer is more than 5 normalized atomic %, the normalized atomic % is the calculation using the sum of analyzed C, O, N, S, Si atomic % as denominator and the analyzed N, S, Si atomic % as numerator. Optionally, nodules may be formed on one or both sides of the copper foil. In some cases, nodules are not present, at least on the laminate-side of electrodeposited copper foil and the deposited-side surface roughness (Rz) is 0.5 to 2.5 μm.

The copper foil is typically electrodeposited copper foil having a thickness of about 1 to about 50 μm.

The barrier layer typically includes Ni, Zn, Co, Mn, Sn or a mixture thereof, for example, the barrier layer may include a mixture of Zn and Ni (and be free or essentially free of Co). Furthermore, the ratio of Zn to Ni (Zn/Ni) may be about 0.6 or greater.

The organic layer typically includes one or more organic molecules comprising a thermally stable base bearing one or more binding groups configured to bind to the barrier layer(s) and/or an organic molecule comprising one or more attachment groups configured to attach to a resin. In some cases, the organic layer does not include more than 40 normalized atomic % of elemental oxygen.

The present disclosure further relates to circuit boards comprising the surface-treated copper foil, for example, printed circuit boards comprising a resinous substrate and the surface-treated copper foil. Circuit boards are used in electronic devices. Therefore, the instant disclosure also relates to electronic devices comprising the circuit boards.

Finally, the present disclosure relates to processes for making surface-treated copper foil. For instance, the surface-treated copper foil may be manufactured by: (a) performing an electrochemical reaction to produce copper foil; optionally, (b) electroplating a barrier layer comprising Ni, Zn, Co, Mo, Sn or a mixture thereof, onto one or both sides of the copper foil; and (c) applying an organic layer onto one or both side of the copper foil or one or both of the barrier layer(s). In some cases, the process may also include (d) drying the surface-treated copper foil at a temperature of about 50° C. to about 150° C., after application of the organic layer.

BRIEF DESCRIPTION OF THE DRAWINGS

Implementations of the present technology will now be described, by way of example only, with reference to the attached figures, wherein.

Figure 1:
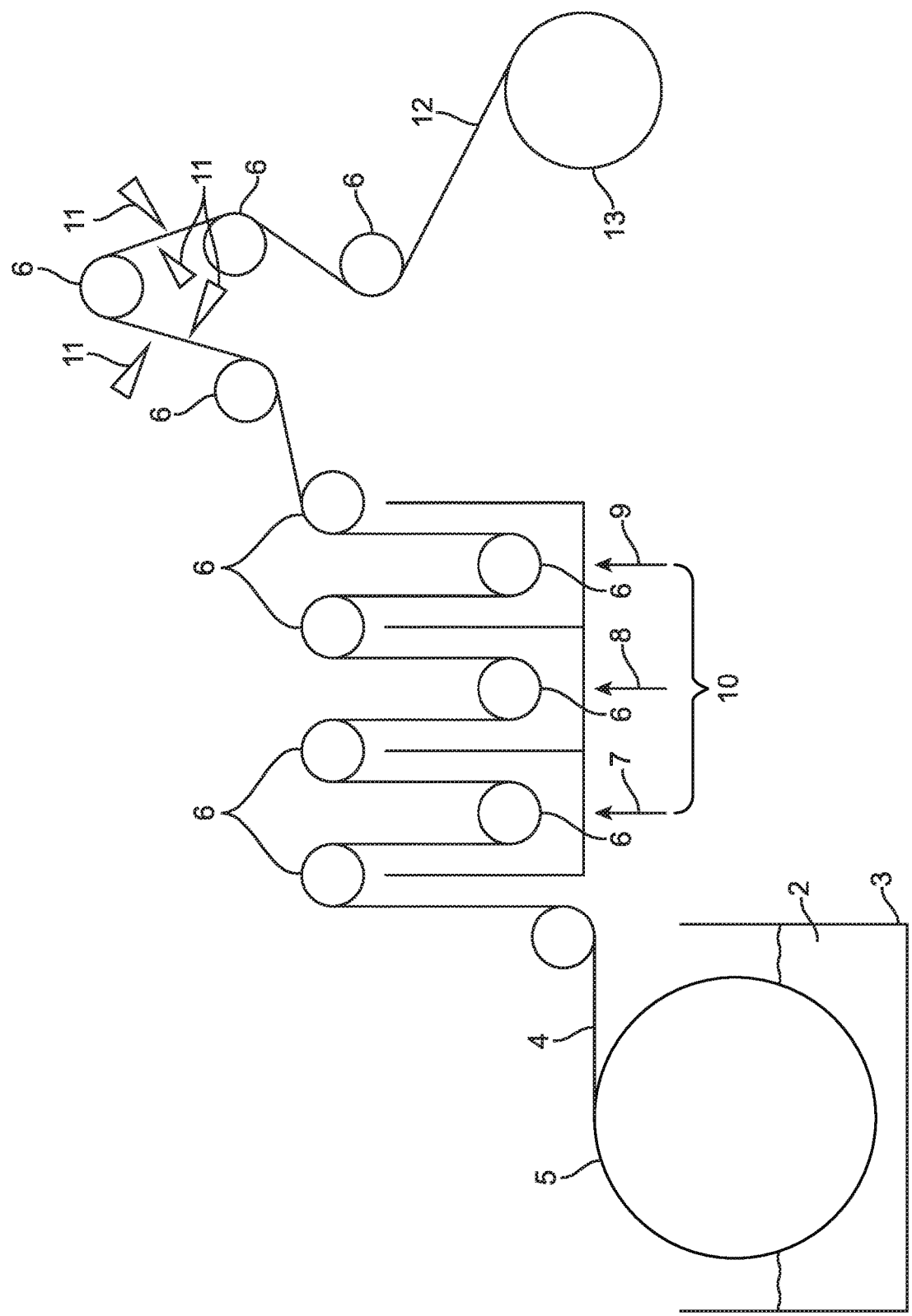
FIG. 1 is a diagram showing a manufacturing process for the surface-treated copper foil according to the present disclosure.

It should be understood that the various aspects are not limited to the arrangements and instrumentality shown in the drawings.

DETAILED DESCRIPTION OF THE DISCLOSURE

The present disclosure relates to a chromium-free surface-treated copper foil comprising: (a) copper foil; and (c) an organic layer disposed on the copper foil, wherein the sum total of the N, S, and Si elements of the organic layer is more than 5 normalized atomic %. The chromium-free surface-treated copper foil further comprising (b) a barrier layer between (a) the copper foil and (c) the organic layer, the barrier layer comprising Ni, Zn, Co, Mn, Sn or a mixture thereof. The chromium-free surface-treated copper foil can further comprise a second barrier layer and a second organic layer, wherein the barrier layers are disposed on both sides both sides of the copper foil and the organic layers are disposed on the barrier layer. Furthermore, the chromium-free surface-treated copper foil optionally includes nodules on one or both sides of the copper foil.

The thickness of the copper foil portion of the chromium-free surface-treated copper foil is typically from about 1 to about 50 µm. In some instances, the thickness may be about 1 to about 25 µm, about 1 to about 15 µm, from about 4 to about 50 µm, from about 4 to about 25 µm, from about 4 to about 20 µm, from about 4 to about 15 µm, from about 6 to about 50 µm, from about 6 to about 25 µm, from about 6 to about 20 µm, or from about 8 to about 16 µm. The copper foil layer may have a thickness of about 4, 5, 6, 7, 8, 9, 10, 11, 12, 13, 14, 15, 16, 17, 18, 19, 20, 21, 22, 23, 24, 25, 26, 27, 28, 29, or 30 µm.

The thickness of the barrier layer(s), if present, is/are typically about 0.2 µm to about 100 µm. In some instances, the thickness is about 0.2 µm to about 50 µm, about 0.2 µm to about 25 µm, about 5 to about 100 µm, about 5 to about 50 µm, about 5 to about 25 µm, about 10 µm to about 100 µm, about 10 to about 50 µm, or about 10 to about 25 µm.

As mentioned previously, the sum total of the N, S, and Si elements of the organic layer is at least 5 normalized atomic %. In some cases, the sum total of the N, S, and Si elements of the organic layer may be greater than 5 normalized atomic % or at least 5.1 normalized atomic %, or at least 5.2 normalized atomic %. The maximum amount of the sum total of the N, S, and Si elements of the organic layer may vary, but is typically not appreciably higher than about 35 normalized atomic %, 30 normalized atomic %, 25 normalized atomic %, 20 normalized atomic %, 15 normalized atomic %, or 12 normalized atomic %. Thus, in some instances the sum total of the N, S, and Si elements is about 5 normalized atomic % to about 35 normalized atomic %, about 5 normalized atomic % to about 20 normalized atomic %, about 5 normalized atomic % to about 15 normalized atomic %, or about 5 normalized atomic % to about 12 normalized atomic %.

The organic layer comprises one or more organic molecules, which typically include a thermally stable base bearing one or more binding groups configured to bind the barrier layer(s) or the copper foil and/or one or more attachment groups configured to attach to a resin. The binding group includes methoxy group, ethoxy group, dialkoxy group, trialkoxy group, alcohols, ethers, esters, acetylenic benzene, allyl phenyl group, amines, instigate pyrazole, pyrazine, isonicotinate amide, imidazole, bipyridine, and substituted derivative of bipyridine, terpyridine and substituted derivatives thereof, nitriles, isonitriles, phenanthroline class, substituted ortho-phenanthroline derivatives and the like, supplied oxygen, sulfur, phosphorus, nitrogen ligands, mercaptogroup and a combination thereof. The attachment group includes vinyl groups, epoxy groups, Amino groups, Methacryloxy groups, Mercapto groups, thiol group, amines, alcohols, ethers, acetylenes benzene, allyl phenyl group, and phosphonates.

Non-limiting examples of organic molecules that may be used in the formation of the organic layer include porphyrin group, a silane group, benzotriazole, triazine trithiol and a combination thereof.

The porphyin group consisting of a porphyrin, a porphyrinic macrocycle, an expanded porphyrin, a contracted porphyrin, a linear porphyrin polymer, a porphyrinic sandwich coordination complex, a porphyrin array, (5,10,15,20-Tetrakis(4-aminophenyl)-porphyrin-Zn(II)) and a combination thereof.

The silane group is selected from a tetraorgano-silane, aminoethyl-aminopropyl-trimethoxysilane, (3-Aminopropyl)trimethoxysilane, (1-[3-(Trimethoxysilyl)propyl]urea), (3-Aminopropyl)triethoxysilane, ((3-Glycidyloxypropyl) trimethoxysilane), (3-Chloropropyl)trimethoxysilane, (3-Glycidyloxypropyl)trimethoxysilane, Dimethyldichlorosilane, 3-(Trimethoxysilyl)propyl methacrylate, Ethyltriacetoxysilane, Triethoxy(isobutyl)silane, Triethoxy(octyl) silane, Tris(2-methoxyethoxy)(vinyl)silane, Chlorotrimethylsilane, Methyltrichlorosilane, Silicon tetrachloride, Tetraethoxysilane, Phenyltrimethoxysilane, Chlorotriethoxysilane, ethylene-trimethoxysilane, 1,2,3-benzotriazole, an alkoxysilane having 1 to 20 carbons, a vinylalkoxy silane having 1 to 20 carbons, (meth)acryl silane, a triazine trithiol, and a combination thereof.

In some cases, the one or more organic molecules is selected from the group consisting of 1,2,3-benzotriazole, an alkoxysilane having 1 to 20 carbons, a vinylalkoxy silane having 1 to 20 carbons, (meth)acryl silane, a triazine trithiol (1,3,5-Triazine-2,4,6-trithiol trisodium salt solution) and mixtures thereof. Furthermore, the organic layer may be formed from one or more organic molecules comprising an alkoxysilane having 1 to 20 carbon atoms, for example, $CH_3Si(OCH_3)_3$. The organic layer may optionally include oxygen. However, in some cases, the amount of elemental oxygen is not more than about 40 normalized atomic %, based on the total weight of the organic layer.

As mentioned previously, the barrier layer(s) on one or both sides of the copper foil, if present, are typically made of Ni, Zn, Co, Mo, Sn or a mixture thereof. The barrier layer may also include only Zn and/or Ni, or a mixture of Zn and Ni. The total amount of the Ni, Zn, Co, Mo, Sn of the barrier layer may vary. For example, each of the individual elements, if present, may be in an amount of about 10 to about 3000 $\mu g/dm^2$, about 10 to about 2500 $\mu g/dm^2$, about 10 to about 2000 $\mu g/dm^2$, or about 10 to about 1500 $\mu g/dm^2$. To be clear, each of the individual elements may be in these amounts individually or in combination with one or more of the other individual elements.

In instances where a barrier layer includes only Zn and Ni (or essentially only Zn and Ni), the total amount of the Zn may be about 50 to about 3000 $\mu g/dm^2$, about 50 to about 1500 $\mu g/dm^2$, about 50 to about 1000 $\mu g/dm^2$, about 50 to about 500 $\mu g/dm^2$, about 50 to about 250 $\mu g/dm^2$, about 75 to about 150 $\mu g/dm^2$, or about 100 to 150 $\mu g/dm^2$. Additionally, the total amount of the Zn in a barrier layer that includes only Zn and Ni (or essentially only Zn and Ni) may be in an amount of about 250 to about 3000 $\mu g/dm^2$, about 500 to about 3000 $\mu g/dm^2$, about 1000 to about 3000 $\mu g/dm^2$, about 1000 to about 2500 $\mu g/dm^2$, about 1000 to about 2000 $\mu g/dm^2$, about 1000 to about 1500 $\mu g/dm^2$, about 1100 to about 1600 $\mu g/dm^2$, or about 1200 to about 1500 $\mu g/dm^2$. The total amount of the Ni in a barrier layer that includes only Zn and Ni may be, for example, from about 10 to about 1000 $\mu g/dm^2$, about 10 to about 800 $\mu g/dm^2$, about 10 to about 750 $\mu g/dm^2$, about 10 to about 500 $\mu g/dm^2$, about 10 to about 250, about 50 to about 1000 $\mu g/dm^2$, about 50 to about 750 µg/dm$^2$, about 50 to about 500 µg/dm$^2$, about 50 to about 250 µg/dm$^2$, about 75 to about 200 µg/dm$^2$, or about 90 to about 130 µg/dm$^2$.

The ratio of Zn to Ni (Zn/Ni) in a barrier layer may vary, but in some cases, is about 0.8 to about 8 in weight ratio. This ratio can apply even when the barrier layer additionally includes Co or other materials. In some cases, the ratio of Zn to Ni is about 0.6, or greater.

In some cases, the chromium-free surface-treated copper foil does not have nodules. The deposited-side of the surface-treatment (without nodules) may therefore have a surface roughness (Rz) of about 0.5 to about 2.5 µm. The surface roughness may also be about 0.8 to about 2.0 µm, about 0.8 to about 1.8 µm, or about 0.8 to about 1.6 µm. Additionally, the surface roughness may be about 1.0 to about 2.5 µm, about 1.2 to about 2.5 µm, about 1.5 to about 2.5 µm, or about 1 to about 2 µm.

As previously noted, the surface-treated copper foil is free of chromium, or essentially free of chromium. Moreover, in some instances, the surface-treated copper foil does not include a copper oxide layer. For example, the surface-treated copper foil that is free or essentially free of chromium and free or essentially free of a copper oxide layer. In some cases, so long as the surface-treated copper foil is free or essentially free of chromium, the surface-treated copper foil may include a copper oxide layer.

The instant disclosure relates to methods for manufacturing the surface-treated copper foil discussed above. Such methods typically include: (a) performing an electrochemical reaction to produce copper foil; optionally, (b) electroplating a barrier layer comprising Ni, Zn, Co, Mo, Sn or a mixture thereof, onto one or both sides of the copper foil; and (c) applying an organic layer onto one or both sides of the copper foil or one or both of the barrier layer(s). The processes may further, optionally include: (d) drying the surface-treated copper foil at a temperature between 50° C. and 150° C. after applying the organic layer.

The surface-treated copper foil of the present disclosure is particularly well-suited for use with printed circuit boards. This is because it is surprisingly resistant to deterioration, corrosion, and discoloration, especially when subjected to the heat and pressure needed to bond the surface-treated copper foil to a substrate in the manufacture of the circuit board including those having a resinous substrate. Accordingly, the present disclosure relates to printed circuit boards comprising the surface-treated copper foil described herein. It also relates to methods for making the printed circuit boards. Such processes include obtaining a surface-treated copper foil according to the instant disclosure and combining it with a substrate, such as a resinous substrate to form a circuit board. Often heat and/or pressure are used to attach the surface-treated copper foil to the substrate.

When the inventive chromium-free surface-treated copper foil subjected to the heat or pressure is preventable to the deterioration. Through the peel strength test for both normal and after moisture absorption, the deterioration rate was calculated. The deterioration rate is lower than 30%, lower than 20%, lower than 15%, lower than 10%, lower than 5% or even 0%. The deterioration of the peel strength in normal and after moisture absorption of the surface-treated copper foil shows the resistant to deterioration andoxidation. The circuit boards can be incorporated into electronic devices and therefore the present disclosure relates to electronic devices comprising the circuit boards described herein, which include the surface-treated copper foil of the present disclosure. For example, the circuit boards may be used in electronic devices such as power tools, automobiles, electric vehicles including electric automobiles, cell phones, other portable electronic devices, tablets, home appliances, electronic toys, laboratory equipment, computers, etc.

FIG. 1 is a diagram showing a manufacturing process for chromium-free surface-treated copper foil according to the present disclosure. The initial step in the process is the electrodeposition step used to generate electrodeposited copper foil. At this initial step copper wires are dissolved into a solution 2 inside a bath (e.g. an electrolytic bath) 3 in order to create the copper foil 4 that is fed through the drum 5 to subsequent rollers for further processing, as will be discussed below. As can be seen from FIG. 1, the drum 5 is partially submerged into the solution 2 inside the bath 3.

Thereafter, the process of manufacturing a chromium-free surface-treated copper foil involves feeding the copper foil 4 through a series of rollers 6. As the copper foil travels through the series of rollers 6, the copper foil 4 undergoes one or more of a series of surface treatments including, for example, nodular treatment 7, barrier treatment (anti-corrosion treatment) 8 and organic treatment 9 (herein collectively referred to as treatment process 10). Hereinafter, various examples will be described according to each of which the copper foil 4 undergoes various examples of the treatments process 10. Conditions for each example of the process and the corresponding results are presented in Tables 1 and 2.

Upon completing a specific organic treatment process 9, the copper foil 4 is subjected to drying with wind 11. Finally, the surface treated copper foil 12 is then rolled using the roller 13, and subsequently packaged for shipment (and manufacturing of printed circuit boards).

As mentioned above, the surface treated copper foil 12 is particularly useful for manufacturing printed circuit boards. Such printed circuit boards have various uses across multiple industries and are extensively utilized for building circuits used in computers, mobile devices, home appliances, industrial machines, etc. Such printed circuit boards are manufactured by bonding together the surface treated copper foil 12 and a substrate such as epoxy resin-impregnated glass fiber substrate. In one instance, the bonding is carried out by applying heat and pressure, as is known in the art. Inventive concepts are intended to apply to coupling of the surface treated copper foil 12 to any appropriate substrate using any known method and thus are not limited to the bonding of the surface treated copper foil 12 to an epoxy resin-impregnated glass fiber substrate using heat and pressure, as described above. Upon completion of the bonding of the surface treated copper foil 12 to the epoxy resin-impregnated glass fiber, an etching solution including, but not limited to, acidic or alkaline etching solution is utilized to remove (carve out) portions of the copper foil 4 that are to be non-conductive or are not necessary for making a circuit using the underlying printed circuit board.

Figure 2:
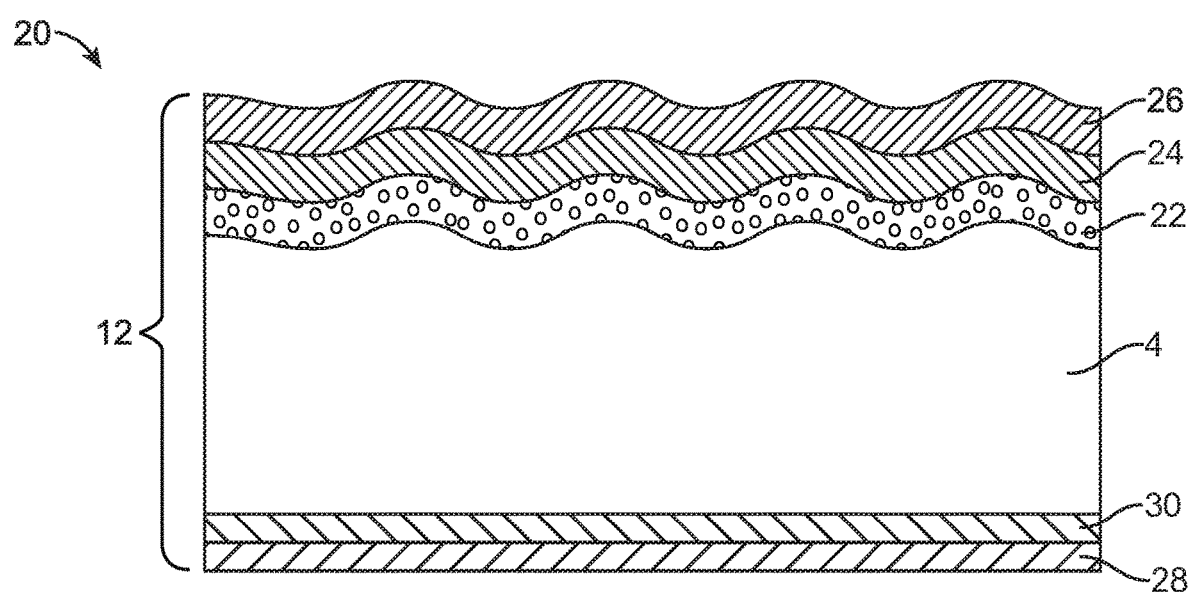
FIG. 2 is a cross sectional the surface-treated copper foil of the present disclosure.

FIG. 2 shows a cross sectional structure of the surface treated copper foil 12 manufactured according to the present disclosure. As shown in FIG. 2, the cross sectional view 20 of the surface treated copper foil 12 includes the copper foil 4 (having a deposited side). At the upper surface (the deposited side) of the copper foil 4, copper nodules 22 are present on the copper foil 4. Although the nodules are shown on the deposited side in FIG. 2, it is important to note that nodules are not required on the either the deposited side or the drum side of the copper foil. Nonetheless, nodules can be included on either or both the deposited side and the drum side of the copper foil.

After optionally forming nodules 22, a barrier layer 24 is applied to one or both sides of the copper foil. FIG. 2 includes a barrier layer 24 on the nodules of the deposited side of copper foil 4 and also includes a second barrier layer 30 on the drum side of copper foil 4. The barrier layers 24, 30 are useful for providing anti-corrosion characteristics and therefore may be referred to as an anti-corrosion layers. Formation of a barrier layer (or anti-corrosion layer) is shown in FIG. 1 as the barrier treatment (anti-corrosion treatment) 8. The barrier layers 24, 30 in some instances, consist of a single metal selected from a group consisting of nickel (Ni), zinc (Zn), cobalt (Co), molybdenum (Mo), tin (Sn) and mixtures thereof. However, in some instances, the barrier layers 24, 30 are an alloy that is a combination of Ni, Zn, Co, Mo and/or Sn. Other metals may also optionally be included to form alloys as long as the metal is not chromium. It is important to note that the barrier layer is not required to be present on either or both nodule sides. In some cases, barrier layers are not required on the either the deposited side or the drum side of the copper foil. Also, note that barrier layer 24 and barrier layer 30 are not required to be identical.

FIG. 2 shows an organic layer 26 that is applied to the barrier layer 24 and a second organic layer 28 that is applied to barrier layer 30. FIG. 1 illustrates the formation of an organic layer in organic treatment 9. Although FIG. 2 includes an organic layer on both barrier layers 24 and 30, it is important to note that an organic layer is not required to be present on both barrier layers. The organic layer(s) 26, 28 may be the same or different.

Hereinafter, various examples will be described according to which the copper foil 4 undergoes various combinations of the treatment process 10. Table 1 provided below lists a specific combination of the treatment process 10 applied to the copper foil 4 to obtain the surface treated copper foil 12. With respect to applying a barrier (Anti-corrosion) treatment, each example has a different combination of Ni, Zn, Co, Mo and Sn elements applied as a barrier layer. The specific application of each element (or combination of elements) is described below:

(a) Zn plating bath: Prepare a zinc sulfate electrolyte containing 5-15 g/l of zinc sulfate ($ZnSO_4.7H_2O$) and 0.1-0.4 g/l of ammonium vanadate. At the liquid temperature of 20° C. and the current density of 0.5 $A/dm^2$;

(b) Ni plating bath: Prepare a nickel sulfate electrolyte containing 170-200 g/l of nickel sulfate ($NiSO_4.6H_2O$) and 20-40 g/l of boric acid at 20° C. and the current density of 0.5 $A/dm^2$;

(c) Ni—Co plating bath: Prepare an electrolyte containing 2-50 g/l of nickel sulfate ($NiSO_4.6H_2O$), 2-50 g/l of Cobalt sulfate ($CoSO_4.7H_2O$) and 50-150 g/l of trisodium citrate dihydrate [$HOC(COONa)(CH_2COONa)_2.2H_2O$] at 20° C. and the current density of 0.5 $A/dm^2$;

(d) Ni—Mo plating bath: Prepare an electrolyte containing 25-250 g/l of nickel sulfate ($NiSO_4.6H_2O$), 1-80 g/l of Sodium molybdate dihydrate ($Na_2MoO_4.2H_2O$) and 50-150 g/l of trisodium citrate dihydrate [$HOC(COONa)(CH_2COONa)_2.2H_2O$] at 20° C. and the current density of 0.5 $A/dm^2$;

(e) Sn plating bath: Prepare a stannate electrolyte containing 1-10 g/l of sodium stannate ($Na_2SnO_3.3H_2O$), 5-10 g/l of sodium hydroxide at 20° C. and the current density of 0.5 $A/dm^2$; and (f) Cr plating bath: A chromic acid electrolyte containing 1-2 g/l of chromium trioxide ($CrO_3$) and 20 g/l of sodium hydroxide at 20° C. and the current density of 1.0 $A/dm^2$.

Example 1

Copper wires were dissolved in a 50 wt % sulfuric acid aqueous solution to prepare a copper sulfate electrolyte containing 320 g/l of copper sulfate ($CuSO_4.5H_2O$) and 100 g/l of sulfuric acid. To per liter of the copper sulfate electrolyte in the solution, 0.24 mg of hydroxyethyl cellulose (LC-400; DAICEL Company), 0.08 mg of gelatin (2CP: Koei Chemical Co., Ltd.) and 25 mg chloride ion were added. Subsequently, the copper foil with a thickness of 18 μm was prepared at the liquid temperature of 50° C. and the current density of 34 $A/dm^2$.

Thereafter, the deposited surface of the copper foil was subjected to a nodular treatment. A copper sulfate electrolyte containing 200 g/l of copper sulfate ($CuSO_4.5H_2O$) and 100 g/l of sulfuric acid was prepared. The copper foil with a thickness of 18 μm was then treated with this solution at the liquid temperature of 25° C. and a current density of 30 $A/dm^2$.

After the nodular treatment, a barrier layer was applied by electrodeposition to the nodules formed on the deposited side of the copper foil. The applied barrier layer was based on (b) Ni plating bath, described above, followed by (a) Zn plating bath.

After application of the barrier layer, an organic layer was applied. Specifically, 0.25% 3-glycidoxypropyl trimethoxysilane (KBM 403; Shin-Etsu Chemical Co.) was applied for 10 seconds. The surface-treated copper foil was then dried as a temperature between 50° C. and 150° C.

Example 2

Copper foil was prepared and treated with nodules and a barrier layer as described in Example 1. However, in this case, triazine trithiol was used as the organic treatment agent. Specifically, 0.25% of triazine trithiol (1,3,5-Triazine-2,4,6-trithiol trisodium salt solution, Sigma-Aldrich) was applied for 10 seconds.

Example 3

Copper foil was prepared and treated with nodules and a barrier layer as described in Example 1. However, in this case, porphyrin was used as the organic treatment agent. Specifically, 0.3% of porphyrin (5,10,15,20-Tetrakis(4-aminophenyl)-porphyrin-Zn(II)) was applied for 10 seconds.

Example 4

Copper foil was prepared and treated with nodules and a barrier layer as described in Example 1. However, in this case, aminopropyltriethoxy silane (KBE 903) was used as the organic treatment agent. Specifically, 0.25% of 3-Aminopropyltriethoxy silane (KBE 903) was applied for 10 seconds.

Example 5

Copper foil was prepared and treated with nodules and a barrier layer as described in Example 1. For the organic layer, a combination of 0.3% of porphyrin (5,10,15,20-Tetrakis(4-aminophenyl)-porphyrin-Zn(II)) and 0.2% of aminopropyltriethoxy silane (KBE 903) was applied for 10 seconds.

Example 6

Copper foil was prepared and treated as described in Example 1. However, a (b) Ni plating bath, described above, was applied for barrier layer. For the organic layer a 0.25% glycidoxypropyl trimethoxysilane (KBM 403) was applied for 10 seconds.

Example 7

Copper foil was prepared and treated with nodules as described in Example 1, However, a (a) Zn plating bath, described above, was applied for barrier layer. For the organic layer, 0.25% glycidoxypropyl trimethoxysilane (KBM 403) was applied for 10 seconds.

Example 8

Copper foil was prepared and treated with nodules as described in Example 1. However, a (c) Ni—Co plating bath, described above, was applied for barrier layer. For the organic layer, 0.25% glycidoxypropyl trimethoxysilane (KBM 403) was applied for 10 seconds.

Example 9

Copper foil was prepared and treated with nodules as described in Example 1. However, a (d) Ni—Mo plating bath, described above, was applied for barrier layer. For the organic layer, 0.25% glycidoxypropyl trimethoxysilane (KBM 403) was applied for 10 seconds.

Example 10

Copper foil was prepared and treated with nodules as described in Example 1. However, a (e) Sn plating bath, described above, was applied for barrier layer. For the organic layer, 0.25% glycidoxypropyl trimethoxysilane (KBM 403) was applied for 10 seconds.

Example 11

Copper foil was prepared as described in Example 1 but the copper foil was not subjected to a nodular treatment (nodules were not added to the copper foil). In this case, a Ni, Zn barrier layer was applied by electrodeposition on the deposited side of the copper foil (Ni plating bath (b) followed by Zn plating bath (a) described above). After application of the barrier layer and for the organic layer, 0.25% glycidoxypropyl trimethoxysilane (KBM 403) was applied for 10 seconds.

Example 12

Copper foil was prepared as described in Example 1 but the copper foil was not subjected to a nodular treatment (nodules were not added to the copper foil). Also no barrier layer was applied in this case. For the organic layer, 0.25% glycidoxypropyl trimethoxysilane (KBM 403) was applied for 10 seconds.

Example 13

Copper foil was prepared and treated with nodules as described in Example 1. No barrier layer was applied in this case. For the organic layer, 0.3% porphyrin (5,10,15,20-Tetrakis(4-aminophenyl)-porphyrin-Zn(II)) was applied for 10 seconds.

Example 14

Copper foil was prepared and treated with nodules and a barrier layer as described in Example 1. For the organic layer, a combination of 0.3% of porphyrin (5,10,15,20-Tetrakis(4-aminophenyl)-porphyrin-Zn(II)) and 0.2% of KBE 903 was applied for 30 seconds.

Comparative Example 1

Copper foil was prepared and treated with nodules as described in Example 1. The barrier layers, however, were formed with a combination of Ni, Zn, and Cr. Zinc sulfate electrolyte containing 10 g/l of zinc sulfate ($ZnSO_4.7H_2O$) and 100 g/l of ammonium vanadate, nickel sulfate electrolyte containing 180 g/l of nickel sulfate ($NiSO_4.6H_2O$) and 30 g/l of boric acid, and a chromic acid electrolyte containing 5 g/l of chromium trioxide ($CrO_3$) and 20 g/l of sodium hydroxide was prepared. For the barrier layer, Ni plating bath (b) followed by Zn plating bath (a) followed by process (f), described above, was applied at a liquid temperature of 20° C. using a current density of 1.0 A/dm$^2$.

No organic layer was added.

Comparative Example 2

Copper foil was prepared and treated with nodules as described in Example 1. For the barrier layer, Ni plating bath (b) followed by Zn plating bath (a), described above, was applied. No organic layer was added.

Comparative Example 3

Copper foil was prepared and treated with nodules as described in Example 1. For the barrier layer, Ni plating bath (b) followed by Zn plating bath (a), described above, was applied. However, in this case, for the organic layer, 0.01% of 3-glycidoxypropyl trimethoxysilane (KBM 403) was applied for 10 seconds.

Comparative Example 4

Copper foil was prepared and treated with nodules as described in Example 1. For the barrier layer, Ni plating bath (b) followed by Zn plating bath (a), described above, was applied. However, in this case, for the organic layer, 0.01% of triazine trithiol was applied for 10 seconds.

Comparative Example 5

Copper foil was prepared and treated with nodules as described in Example 1. For the barrier layer, Ni plating bath (b) followed by Zn plating bath (a), described above, was applied. However, in this case, for the organic layer, 0.05% of porphyrin was applied for 10 seconds.

Comparative Example 6

Copper foil was prepared and treated with nodules as described in Example 1. For the barrier layer, Ni plating bath (b) followed by Zn plating bath (a), described above, was applied. However, in this case, for the organic layer, 0.01% of 3-aminopropyltriethoxy silane (KBE 903; Shin-Etsu Chemical Co.) was applied for 10 seconds.

Comparative Example 7

Copper foil was prepared and treated with nodules as described in Example 1. For the barrier layer, Ni plating bath (b) followed by Zn plating bath (a), described above, was applied. For the organic layer, a combination of 0.03% porphyrin and 0.02% 3-aminopropyltriethoxy silane (KBE 903) was applied for 10 seconds.

Comparative Example 8

Copper foil was prepared and treated with nodules as described in Example 1. For the barrier layer, Ni plating bath (b), described above, was applied. For the organic layer, 0.01% of 3-glycidoxypropyl trimethoxysilane (KBM 403) was applied for 10 seconds.

Comparative Example 9

Copper foil was prepared and treated with nodules as described in Example 1. For the barrier layer, Zn plating bath (a), described above, was applied. For the organic layer, 0.01% of 3-glycidoxypropyl trimethoxysilane (KBM 403) was applied for 10 seconds.

Comparative Example 10

Copper foil was prepared and treated with nodules as described in Example 1. For the barrier layer, Ni—Co plating bath (c), described above, was applied. For the organic layer, 0.01% of 3-glycidoxypropyl trimethoxysilane (KBM 403) was applied for 10 seconds.

Comparative Example 11

Copper foil was prepared and treated with nodules as described in Example 1. For the barrier layer, Ni—Mo plating bath (d), described above, was applied. For the organic layer, 0.01% of 3-glycidoxypropyl trimethoxysilane (KBM 403) was applied for 10 seconds.

Comparative Example 12

Copper foil was prepared and treated with nodules as described in Example 1. For the barrier layer, Sn plating bath (e), described above, was applied. For the organic layer, 0.01% of 3-glycidoxypropyl trimethoxysilane (KBM 403) was applied for 10 seconds.

Comparative Example 13

Copper foil was prepared as described in Example 1. No nodular treatment was applied. For the barrier layer, Ni plating bath (b) followed by Zn plating bath (a), described above, was applied. No organic layer was applied.

Comparative Example 14

Copper foil was prepared as described in Example 1. No nodular treatment, or barrier layer or organic layer was applied.

Comparative Example 15

Copper foil was prepared and treated with nodules as described in Example 1. No barrier layer or organic layer was applied.

A summary of the Examples 1-13 and Comparative Examples 1-15 is provided below in Table 1.

TABLE 1

| | Electroplating of copper foil | Nodular treatment | Barrier (Anti-corrosion treatment | Organic treatment |
|---|---|---|---|---|
| Example 1 | ◯ | ◯ | Ni→Zn | 0.25% 3-Glycidoxypropyl trimethoxysilane |
| Example 2 | ◯ | ◯ | Ni→Zn | 0.25% triazine trithiol |
| Example 3 | ◯ | ◯ | Ni→Zn | 0.3% porphyrin |
| Example 4 | ◯ | ◯ | Ni→Zn | 0.25% 3-Aminopropyltriethoxysilane |
| Example 5 | ◯ | ◯ | Ni→Zn | (0.3% porphyrin + 0.2% 3-Aminopropyltriethoxysilane) |
| Example 6 | ◯ | ◯ | Ni | 0.25% 3-Glycidoxypropyl trimethoxysilane |
| Example 7 | ◯ | ◯ | Zn | 0.25% 3-Glycidoxypropyl trimethoxysilane |
| Example 8 | ◯ | ◯ | Ni—Co | 0.25% 3-Glycidoxypropyl trimethoxysilane |
| Example 9 | ◯ | ◯ | Ni—Mo | 0.25% 3-Glycidoxypropyl trimethoxysilane |
| Example 10 | ◯ | ◯ | Sn | 0.25% 3-Glycidoxypropyl trimethoxysilane |
| Example 11 | ◯ | X | Ni—Zn | 0.25% 3-Glycidoxypropyl trimethoxysilane |
| Example 12 | ◯ | X | X | 0.25% 3-Glycidoxypropyl trimethoxysilane |
| Example 13 | ◯ | ◯ | X | 0.3% porphyrin |
| Example 14 | ◯ | ◯ | Ni→Zn | (0.3% porphyrin + 0.2% 3-Aminopropyltriethoxysilane) |
| Comparative 1 | ◯ | ◯ | Ni→Zn→Cr | X |
| Comparative 2 | ◯ | ◯ | Ni→Zn | X |
| Comparative 3 | ◯ | ◯ | Ni→Zn | 0.01 3-Glycidoxypropyl trimethoxysilane |
| Comparative 4 | ◯ | ◯ | Ni→Zn | 0.01% triazine trithiol |
| Comparative 5 | ◯ | ◯ | Ni→Zn | 0.05% porphyrin |
| Comparative 6 | ◯ | ◯ | Ni→Zn | 0.01 3-Aminopropyltriethoxysilane |
| Comparative 7 | ◯ | ◯ | Ni→Zn | (0.03% porphyrin + 0.02% 3-Aminopropyltriethoxysilane) |
| Comparative 8 | ◯ | ◯ | Ni | 0.01% 3-Glycidoxypropyl trimethoxysilane |

TABLE 1-continued

|  | Electroplating of copper foil | Nodular treatment | Barrier (Anti-corrosion treatment) | Organic treatment |
|---|---|---|---|---|
| Comparative 9 | ○ | ○ | Zn | 0.01% 3-Glycidoxypropyl trimethoxysilane |
| Comparative 10 | ○ | ○ | Ni—Co | 0.01% 3-Glycidoxypropyl trimethoxysilane |
| Comparative 11 | ○ | ○ | Ni—Mo | 0.01% 3-Glycidoxypropyl trimethoxysilane |
| Comparative 12 | ○ | ○ | Sn | 0.01% 3-Glycidoxypropyl trimethoxysilane |
| Comparative 13 | ○ | X | Ni→Zn | X |
| Comparative 14 | ○ | X | X | X |
| Comparative 15 | ○ | ○ | X | X |

The various surface-treated copper foils of Examples 1-13 and Comparative Examples 1-15 were analyzed to determine the elemental content of the organic layer and the metal content of the barrier layers, when present. After the surface-treated copper foils were analyzed and characterized, the surface-treated copper foils were evaluated for corrosion resistance and peel strength.

Measurement of Atomic Ratio of Organic Layer

The surface of the laminate side of copper foil after forming the organic layer in each example and comparative example was analyzed through ESCA to evaluate the atomic %. The atomic % of the organic layer was determined using an ESCA Scientific Theta Probe (Model: 2012) manufactured by VG Corporation (under beam energy=3 kv, current=1 mA).

The analyzed C, O, N, S, Si atomic % of the organic layer on the laminate side of the copper foil is further normalized by using sum of C, O, N, S and Si atomic % as the denominator in the calculation ("normalized atomic %").

Measurement of Metal Content of the Barrier Layer

The metal content of the barrier layers was determined by cutting the surface-treated copper foils to a size of 150×150 mm and placing a protective coating on one side of the surface-treated copper foil (the coating prevents this side of the copper foil from dissolving). After drying, the specimens were further cut into a size of 100×100 mm (area=1 dm$^2$). The specimens were put into a dish and dissolved with 25 ml of 18% HCl solution. The resulting solutions were made up with water to 50 mL and analyzed by inductively coupled plasma (ICP) analysis.

Measurement of Corrosion Resistance of the Surface Treated Copper Foil

Corrosion resistance was determined by observing whether the surface of the surface-treated copper foil has oxidation spots. Spots are ranked on a scale of 1 to 10 points. The surface was cut into a size of A4 (i.e., 210 mm×297 mm). In each cut portion if the surface treated copper foil has spot with a rank higher than 5, the surface-treated copper foil fails the test. The surface treated copper foil was analyzed after the surface-treated copper foil was subjected to a temperature of 70° C./80% RH (relative humidity) for 14 hours.

Measurement of Peel Strength of the Surface Treated Copper Foil

Peel strength was determined for both normal conditions and after moisture absorption; and the deterioration rate was calculated. The procedure of IPC-TM-650 was followed. The surface-treated copper foils were cut to obtain test samples of size 100 mm×12.7 mm (length×width). For the moisture absorption testing, the samples were subject to boiling for 2 hours in deionized water. The peel strength of each sample was measured at room temperature (about 25° C.) using a chuck distance of 50 mm and a crosshead speed of 50 mm/min with a Model AG-I testing machine from the Shimadzu Corporation. The results of the peel strength test and the results of the peel strength test after moisture absorption were used to determine the deterioration rate (%), according to the following formula.

$$\text{Deterioration rate (\%)} = \frac{\text{Normal peel strength} - \text{Peel strength after moisture absorption}}{\text{Normal peel strength}} * 100\%$$

The results of the various test described above are summarized in Table 2.

TABLE 2

|  | Corrosion Resistance | The element content of the organic layer on the laminate side of the copper foil (normalized atomic%) | | | | | | The amount of Cr on the copper foil (ug/dm$^2$) | | Peel strength (kg/cm) | | Deterioration rate(%) |
|---|---|---|---|---|---|---|---|---|---|---|---|---|
|  |  | C | O | N | S | Si | N + S + Si | resist | laminate | normal | after moisture absorption |  |
| Example 1 | O | 47.1 | 47.1 | 0.0 | 0.0 | 5.8 | 5.8 | 0.0 | 0.0 | 1.50 | 1.49 | 0.7 |
| Example 2 | O | 59.8 | 27.0 | 4.9 | 8.3 | 0.0 | 13.2 | 0.0 | 0.0 | 1.53 | 1.32 | 13.7 |
| Example 3 | O | 51.4 | 37.2 | 11.4 | 0.0 | 0.0 | 11.4 | 0.0 | 0.0 | 1.42 | 1.28 | 9.9 |
| Example 4 | O | 50..8 | 37.5 | 3.8 | 0.0 | 7.9 | 11.7 | 0.0 | 0.0 | 1.32 | 1.29 | 2.3 |
| Example 5 | O | 47.0 | 36.5 | 11.8 | 0.0 | 4.8 | 16.6 | 0.0 | 0.0 | 1.45 | 1.39 | 4.7 |
| Example 6 | O | 44.7 | 48.7 | 0.0 | 0.0 | 6.7 | 6.7 | 0.0 | 0.0 | 1.46 | 1.37 | 6.2 |
| Example 7 | O | 49.0 | 43.6 | 0.0 | 0.0 | 7.3 | 7.3 | 0.0 | 0.0 | 1.35 | 1.25 | 7.4 |
| Example 8 | O | 45.2 | 48.5 | 0.0 | 0.0 | 6.3 | 6.3 | 0.0 | 0.0 | 1.42 | 1.31 | 7.7 |
| Example 9 | O | 43.9 | 47.9 | 0.0 | 0.0 | 8.2 | 8.2 | 0.0 | 0.0 | 1.38 | 1.32 | 4.3 |

TABLE 2-continued

|  | Corrosion Resistance | The element content of the organic layer on the laminate side of the copper foil (normalized atomic%) | | | | | | The amount of Cr on the copper foil (ug/dm²) | | Peel strength (kg/cm) | | Deterioration rate(%) |
|  |  | C | O | N | S | Si | N + S + Si | resist | laminate | normal | after moisture absorption |  |
| --- | --- | --- | --- | --- | --- | --- | --- | --- | --- | --- | --- | --- |
| Example 10 | O | 48.9 | 42.4 | 0.0 | 0.0 | 8.7 | 8.7 | 0.0 | 0.0 | 1.40 | 1.26 | 10.0 |
| Example 11 | O | 49.9 | 40.3 | 5.8 | 0.0 | 4.0 | 9.8 | 0.0 | 0.0 | 0.81 | 0.75 | 7.4 |
| Example 12 | O | 44.9 | 39.1 | 16.0 | 0.0 | 0.0 | 16.0 | 0.0 | 0.0 | 0.86 | 0.76 | 11.6 |
| Example 13 | O | 45.8 | 41.4 | 12.8 | 0.0 | 0.0 | 12.8 | 0.0 | 0.0 | 1.45 | 1.31 | 9.7 |
| Example 14 | O | 36.1 | 31.1 | 24.4 | 0.0 | 8.4 | 32.8 | 0.0 | 0.0 | 1.57 | 1.57 | 0.0 |
| Comparative 1 | O | 50.2 | 49.8 | 0.0 | 0.0 | 0.0 | 0.0 | 20.5 | 45.0 | 1.31 | 0.96 | 27.1 |
| Comparative 2 | O | 37.2 | 62.8 | 0.0 | 0.0 | 0.0 | 0.0 | 0.0 | 0.0 | 1.06 | 0.67 | 36.8 |
| Comparative 3 | O | 51.3 | 45.2 | 0.0 | 0.0 | 3.5 | 3.5 | 0.0 | 0.0 | 1.15 | 0.74 | 35.7 |
| Comparative 4 | O | 54.3 | 41.3 | 1.8 | 2.5 | 0.0 | 4.3 | 0.0 | 0.0 | 1.32 | 0.61 | 53.8 |
| Comparative 5 | O | 51.0 | 45.6 | 3.4 | 0.0 | 0.0 | 3.4 | 0.0 | 0.0 | 1.20 | 0.81 | 32.5 |
| Comparative 6 | O | 50.2 | 44.9 | 2.4 | 0.0 | 2.6 | 4.9 | 0.0 | 0.0 | 1.23 | 0.81 | 34.1 |
| Comparative 7 | O | 51.0 | 44.4 | 1.8 | 0.0 | 2.8 | 4.6 | 0.0 | 0.0 | 1.31 | 0.82 | 37.4 |
| Comparative 8 | O | 50.6 | 44.5 | 0.0 | 0.0 | 4.9 | 4.9 | 0.0 | 0.0 | 1.23 | 0.76 | 38.2 |
| Comparative 9 | O | 50.7 | 45.9 | 0.0 | 0.0 | 3.4 | 3.4 | 0.0 | 0.0 | 1.19 | 0.80 | 32.8 |
| Comparative 10 | O | 47.5 | 48.7 | 0.0 | 0.0 | 3.9 | 3.9 | 0.0 | 0.0 | 1.16 | 0.85 | 26.7 |
| Comparative 11 | O | 52.8 | 42.6 | 0.0 | 0.0 | 4.7 | 4.7 | 0.0 | 0.0 | 1.21 | 0.91 | 24.8 |
| Comparative 12 | O | 53.78 | 41.8 | 0.0 | 0.0 | 4.4 | 4.4 | 0.0 | 0.0 | 1.17 | 0.65 | 44.4 |
| Comparative 13 | O | 50.9 | 49.1 | 0.0 | 0.0 | 0.0 | 0.0 | 0.0 | 0.0 | 0.80 | 0.56 | 30.0 |
| Comparative 14 | X | 42.2 | 57.8 | 0.0 | 0.0 | 0.0 | 0.0 | 0.0 | 0.0 | 0.89 | 0.54 | 39.3 |
| Comparative 15 | X | 35.4 | 64.6 | 0.0 | 0.0 | 0.0 | 0.0 | 0.0 | 0.0 | 1.14 | 0.74 | 35.1 |

Examples 1-14 and test results associated therewith were described above. Common between Examples 1-14 are the following:

(1) In each of the Examples 1-14, the surface treated copper foil is chromium-free;
(2) In each of the Examples 1-14, the combined percentages of elements N, S and Si on the surface of the surface treated copper foil is greater than 5 normalized atomic %; and
(3) In each of the Examples 1-14, the deterioration rate of the peel strength of the surface-treated copper foil is considerably lower than the deterioration rates of the peel strength of Comparative Examples 1-15.

The above embodiments are only used to illustrate the principle of the present disclosure and the effect thereof, and should not be construed as to limit the present disclosure. The above embodiments can be modified and altered by those skilled in the art, without departing from the spirit and scope of the present disclosure. Therefore, the protection scope of the present disclosure is defined in the following appended claims. As long as it does not affect the effects and achievable goals of this disclosure, it should be covered under the technical contents disclosed herein.

The terms "comprising," "having," and "including" are used in their open, non-limiting sense.

The terms "a" and "the" are understood to encompass the plural as well as the singular. The expression "at least one" means one or more and thus includes individual components as well as mixtures/combinations.

The term "about" when referring to a value is meant specifically that a measurement can be rounded to the value using a standard convention for rounding numbers. For example, "about 1.5" is 1.45 to 1.54.

The terms "O" and "X" are used in the tables. The term "O" indicated "yes" or "affirmative." The term "X" indicates "no" or "fail."

The term "directly" can be used in conjunction with terms such as "to" or "on" to result in phrases such as "directly on" and "directly "to." Such phrases may be especially useful when referring to components or layers and their relationship to one another. This phraseology (i.e., phraseology using the modifier "directly") indicates that components or layers that are "directly on" one another or applied "directly to" one another are in physical contact with each other such that no intervening component(s) or layer(s) is present. For example, if layer A is directly on layer B, layer A and layer B are in physical contact with each other and no intervening layer (such as a layer C) can lie between layer A and layer B.

All ranges and values disclosed herein are inclusive and combinable. For examples, any value or point described herein that falls within a range described herein can serve as a minimum or maximum value to derive a sub-range, etc.

All publications and patent applications cited in this specification are herein incorporated by reference, and for any and all purposes, as if each individual publication or patent application were specifically and individually indicated to be incorporated by reference. In the event of an inconsistency between the present disclosure and any publications or patent application incorporated herein by reference, the present disclosure controls.

The invention claimed is:

1. A chromium-free surface-treated copper foil comprising:
(a) a copper foil; and
(c) an organic layer disposed on the copper foil, wherein the sum total of the N, S, and Si elements of the organic layer is more than 5 normalized atomic %, the normalized atomic % is the calculation using the sum of analyzed C, O, N, S, Si atomic % as the denominator and the analyzed N, S, Si atomic % as the numerator, wherein 59.8>C>36.1 normalized atomic % and 48.7>O>27 normalized atomic %.

2. The chromium-free surface-treated copper foil of claim 1 further comprising (b) a barrier layer between (a) the copper foil and (c) the organic layer, the barrier layer comprising Ni, Zn, Co, Mn, Sn or a mixture thereof.

3. The chromium-free surface-treated copper foil of claim 1, wherein the copper foil of (a) has nodules on one or both sides of the copper foil.

4. The chromium-free surface-treated copper foil of claim 1, wherein the copper foil of (a) has a thickness of 1 to 50 µm.

5. The chromium-free surface-treated copper foil of claim 2, wherein the barrier layer has a thickness of 0.2 to 100 µm.

6. The chromium-free surface-treated copper foil of claim 2, wherein the copper foil of (a) has nodules on one or both sides of the copper foil.

7. The chromium-free surface-treated copper foil of claim 2 further comprising a second barrier layer and a second organic layer, wherein the barrier layers are disposed on both sides of the copper foil and the organic layers are disposed on the barrier layer.

8. The chromium-free surface-treated copper foil of claim 2, wherein the organic layer of (c) comprises one or more organic molecules comprising a thermally stable base bearing one or more binding groups configured to bind the barrier layer of (b).

9. The chromium-free surface-treated copper foil of claim 8, wherein the one or more organic molecules further comprises one or more attachment groups configured to attach to a resin.

10. The chromium-free surface-treated copper foil of claim 8, wherein the one or more organic molecules is selected from the group consisting of a porphyrin group, a silane group, benzotriazole, triazine trithiol, and a combination thereof.

11. The chromium-free surface-treated copper foil of claim 10, wherein the one or more organic molecules is selected from the porphyrin group consisting of a porphyrin, a porphyrinic macrocycle, an expanded porphyrin, a contracted porphyrin, a linear porphyrin polymer, a porphyrinic sandwich coordination complex, a porphyrin array and a combination thereof.

12. The chromium-free surface-treated copper foil of claim 10, wherein the silane group is a tetraorgano-silane.

13. The chromium-free surface-treated copper foil of claim 12, wherein the tetraorgano-silane is selected from a aminoethyl-aminopropyl-trimethoxysilane, (3-Aminopropyl)trimethoxysilane, (1-[3-(Trimethoxysilyl)propyl]urea), (3-Aminopropyl)triethoxysilane, ((3-Glycidyloxypropyl)trimethoxysilane), (3-Chloropropyl)trimethoxysilane, (3-Glycidyloxypropyl)trimethoxysilane, Dimethyldichlorosilane, 3-(Trimethoxysilyl)propyl methacrylate, Ethyltriacetoxysilane, Triethoxy(isobutyl)silane, Triethoxy(octyl)silane, Tris(2-methoxyethoxy)(vinyl)silane, Chlorotrimethylsilane, Methyltrichlorosilane, Silicon tetrachloride, Tetraethoxysilane, Phenyltrimethoxysilane, Chlorotriethoxysilane, ethylene-trimethoxysilane, and a combination thereof.

14. The chromium-free surface-treated copper foil of claim 8, wherein the one or more organic molecules is selected from the group consisting of an alkoxysilane having 1 to 20 carbons, a vinylalkoxy silane having 1 to 20 carbons, (meth)acryl silane, and mixtures thereof.

15. The chromium-free surface-treated copper foil of claim 1, wherein the organic layer of (c) comprises not more than 40 normalized atomic % of O element, based on the total weight of the organic layer.

16. The chromium-free surface-treated copper foil of claim 2, wherein a weight ratio of Zn to Ni is between 0.8 to 8.

17. The chromium-free surface-treated copper foil of claim 2, wherein the copper foil of (a) does not comprise nodules and has a deposited-side surface roughness (Rz) of 0.5 to 2.5 µm.

18. The chromium-free surface-treated copper foil of claim 1 having a deterioration rate represented by a change in peel strength represented by the formula:

$$\text{Deterioration rate (\%)} = \frac{\text{Normal peel strength} - \text{Peel strength after moisture absorption}}{\text{Normal peel strength}} * 100\%$$

below 20%.

19. The chromium-free surface-treated copper foil of claim 2 having a deterioration rate represented by a change in peel strength represented by the formula:

$$\text{Deterioration rate (\%)} = \frac{\text{Normal peel strength} - \text{Peel strength after moisture absorption}}{\text{Normal peel strength}} * 100\%$$

below 20%.

20. A printed circuit board comprising a resinous substrate and the surface-treated copper foil of claim 1.

21. The chromium-free surface-treated copper foil according to claim 1, wherein the sum total of the N+S+Si elements in the organic layer satisfies the expression 32.8>N+S+Si>5 normalized atomic %.

22. The chromium-free surface-treated copper foil according to claim 1, wherein the C content is in the range 51.4>C>36.1 normalized atomic %.

* * * * *